(12) United States Patent
Chu et al.

(10) Patent No.: US 8,067,282 B2
(45) Date of Patent: Nov. 29, 2011

(54) METHOD FOR SELECTIVE FORMATION OF TRENCH

(75) Inventors: Pin-Chien Chu, Kaohsiung County (TW); Shin-Chi Chen, Penghu County (TW); Po-Lun Cheng, Kao-Hsiung Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/575,484

(22) Filed: Oct. 8, 2009

(65) Prior Publication Data

US 2011/0086479 A1 Apr. 14, 2011

(51) Int. Cl.
*H01L 21/8238* (2006.01)
(52) U.S. Cl. .................. 438/221; 438/218; 438/232
(58) Field of Classification Search .................. 438/218, 438/221, 232
See application file for complete search history.

(56) References Cited

U.S. PATENT DOCUMENTS

| | | | | |
|---|---|---|---|---|
| 6,165,826 A | * | 12/2000 | Chau et al. | 438/231 |
| 7,402,496 B2 | * | 7/2008 | Liu et al. | 438/300 |
| 7,442,967 B2 | * | 10/2008 | Ko et al. | 257/192 |
| 7,816,686 B2 | * | 10/2010 | Pan et al. | 257/65 |
| 2005/0035470 A1 | * | 2/2005 | Ko et al. | 257/900 |
| 2006/0189056 A1 | * | 8/2006 | Ko et al. | 438/197 |
| 2007/0045729 A1 | * | 3/2007 | Hoentschel et al. | 257/344 |
| 2008/0090349 A1 | * | 4/2008 | Hoentschel et al. | 438/229 |
| 2009/0174002 A1 | * | 7/2009 | Ouyang et al. | 257/369 |

\* cited by examiner

*Primary Examiner* — Jarrett Stark
*Assistant Examiner* — John M Parker
(74) *Attorney, Agent, or Firm* — Winston Hsu; Scott Margo

(57) ABSTRACT

A method for selective formation of trenches is disclosed. First, a substrate is provided. The substrate includes a first semiconductor element and a second semiconductor element. The first semiconductor element has a dopant. Second, a wet etching procedure is carried out to selectively form a pair of trenches in the substrate around the second semiconductor element, a first source/drain ion implantation is selectively carried out on the first semiconductor element, or a second source/drain ion implantation is selectively carried out on the second semiconductor element.

15 Claims, 6 Drawing Sheets

METHOD FOR SELECTIVE FORMATION OF TRENCH

BACKGROUND OF THE INVENTION

1. Field of the Invention

The present invention generally relates to a method for selective formation of trenches. In particular, the present invention relates to a method to change the etching selectivity of a substrate by dopant prior to selective formation of trenches around a semiconductor element without the protection of a mask.

2. Description of the Prior Art

Generally speaking, in a semiconductor manufacturing process, an additional mask is needed to protect the locations which should remain intact when trenches are needed to be selectively formed in some places in a substrate. FIGS. 1-3 illustrate the conventional way to form trenches at some places of a substrate. As shown in FIG. 1, first, a substrate 101 is provided. There are a P-type semiconductor element 110 and an N-type semiconductor element 120 previously formed in different regions of the substrate 101. There is also a shallow trench isolation 130 disposed between the P-type semiconductor element 110 and the N-type semiconductor element 120 to segregate the P-type semiconductor element 110 and the N-type semiconductor element 120.

Now, as shown in FIG. 2, when trenches are needed to be selectively formed in the substrate 101 around the P-type semiconductor element 110, as described earlier, a mask 140, such as a photoresist, is used to cover the corresponding region around the P-type semiconductor element 110 to keep the P-type semiconductor element 110 from the damages caused by the coming etching step. Next, as shown in FIG. 3, the pre-determined etching step is performed, such as a dry etching procedure, to form the expected trenches 150 in the substrate around the N-type semiconductor element 120.

However, in order to form the mask 140 to cover the corresponding region around the P-type semiconductor element 110 to keep the P-type semiconductor element 110 from the damages of the following etching step, another new reticle must be designed. However, it is well known that it costs a lot of money to design and to make a new reticle. Accordingly, the additional reticle is a heavy cost burden to the manufacturer of the semiconductor. Besides, even though a dry etching procedure has a faster etching rate, it inevitably makes the etching procedure less easily and evenly controlled. In the light of this, people of ordinary skills in the art would understand that the current way to selectively form trenches at some places of a substrate is still possible to be improved.

SUMMARY OF THE INVENTION

The present invention therefore proposes a novel method for selective formation of trenches. By means of the present invention, on one hand the step to construct another mask around the corresponding region of a first type semiconductor element may be omitted. An etching step may be directly carried out to form the expected trenches in the substrate around the second type semiconductor element. On the other hand, the first type semiconductor element is substantially free from the direct damages of the etching step.

A method for selective formation of trenches is disclosed. First, a substrate is provided. The substrate includes a first semiconductor element and a second semiconductor element. The first semiconductor element has a dopant. A SiGe structure is optionally formed around the first semiconductor element. Second, a wet etching procedure is carried out to selectively form a pair of trenches in the substrate around the second semiconductor element, a first source/drain ion implantation is selectively carried out on the first semiconductor element, or a second source/drain ion implantation is selectively carried out on the second semiconductor element. Preferably, the first type semiconductor element is substantially not influenced, damaged or etched for example, by the wet etching procedure. The resultant trenches may be later used for providing the substrate with stress.

In the method of the present invention, the dopant is useful in changing the etching selectivity of the substrate to the wet etching step. Accordingly, the additional mask is omitted to carry out the wet etching step directly and trenches in the substrate around the second semiconductor element are obtained. Omitting one additional mask means much lower manufacturing cost, which is one of the features of the present invention. Because the present invention utilizes beneficial etching selectivity, the first type semiconductor element is substantially not influenced by the wet etching procedure in the absence of the protection of a mask, which is another feature of the present invention.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
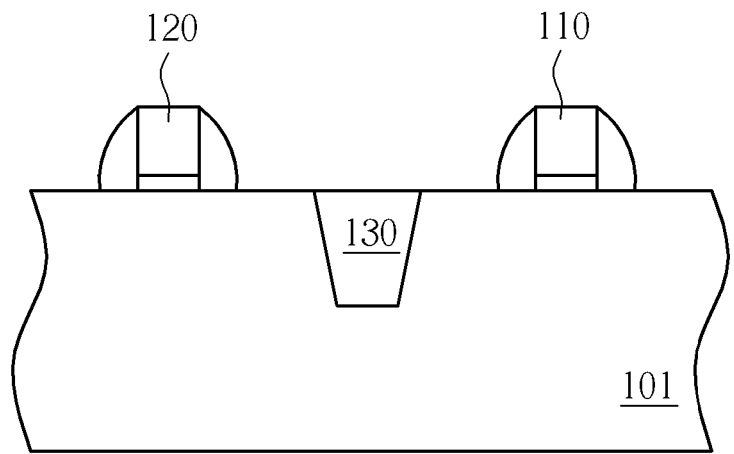
FIGS. 1-3 illustrate the conventional way to form trenches at some places of a substrate.
Figure 2:
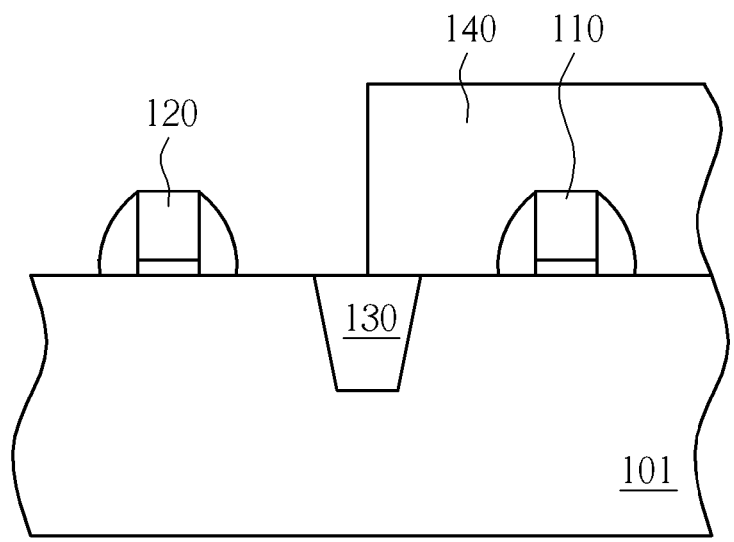
Figure 3:
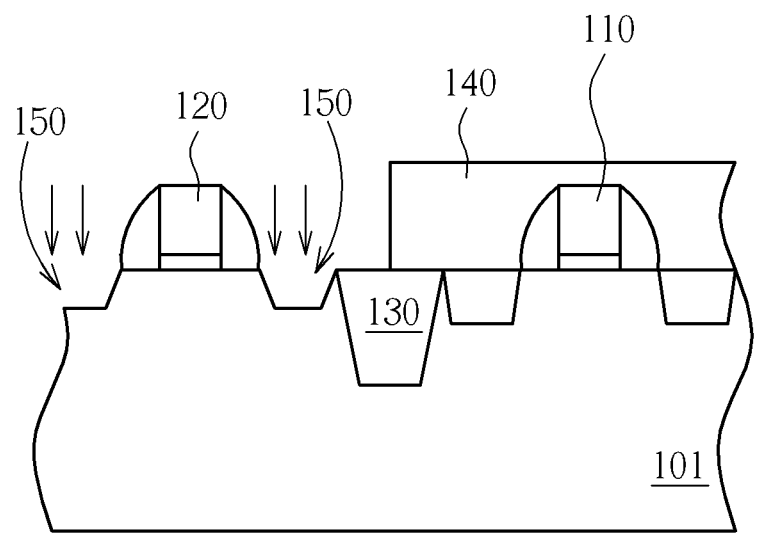
Figure 4:
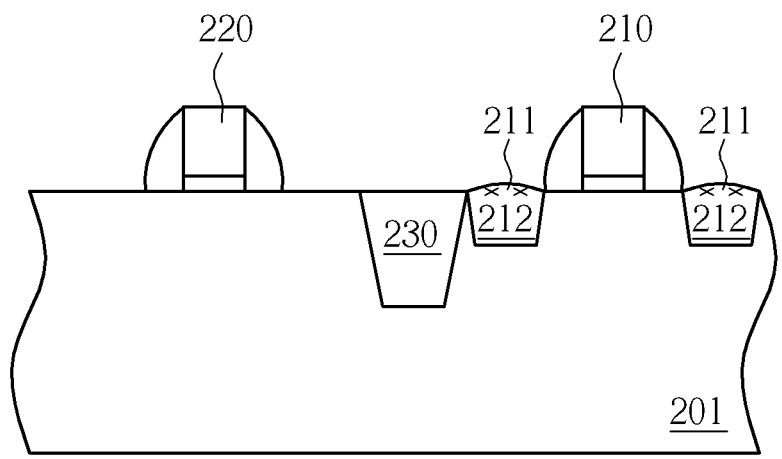
FIGS. 4-11 illustrate a preferred embodiment of the method for selective formation of trenches in a substrate of the present invention.

The present invention provides a novel method for selective formation of trenches in a substrate. FIGS. 4-11 illustrate a preferred embodiment of the method for selective formation of trenches in a substrate of the present invention. Please refer to FIG. 4, first a substrate 201 is provided. The substrate 201 is usually a semiconductor substrate, such as Si substrate. The substrate 201 includes at least a first semiconductor element 210, a second semiconductor element 220 and a shallow trench isolation 230 disposed between the first semiconductor element 210 and the second semiconductor element 220 to segregate the first semiconductor element 210 and the second semiconductor element 220. In this preferred embodiment, the first semiconductor element 210 may be a P-type semiconductor element, such as a P-channel MOSFET, PMOS. The second semiconductor element 220 may be an N-type semiconductor element, such as an N-channel MOSFET, NMOS.

The first semiconductor element 210 has already undergone a first ion implantation step so that the substrate 201 around the first semiconductor element 210 has a dopant 211. However, the second semiconductor element 220 has not undergone the first ion implantation step so that the substrate 201 around the second semiconductor element 220 has no such dopant 211. The first ion implantation step may be carried out by using any suitable dopant, such as ions of Group III or ions of Group V. The first ion implantation step may be but not limited to, a light drain doping (LDD) ion implantation.

In another preferred embodiment of the present invention, there is a SiGe structure 212 disposed around the first semiconductor element 210 with the p-dopant. The SiGe structure 212 is useful in constructing a compressive strained channel so that the gate channel disposed under the first semiconductor element 210 has a compressive stress in order to increase the carrier mobility. Because the first semiconductor element 210 has already undergone the first ion implantation step, there is dopant 211 in the top of the SiGe structure 212, too.

Later, a wet etching procedure, a first source/drain ion implantation and a second source/drain ion implantation are respectively carried out. The order to carry out the wet etching procedure, the first source/drain ion implantation and the second source/drain ion implantation may be optionally switched. The followings are examples of some possible orders.

Figure 5:
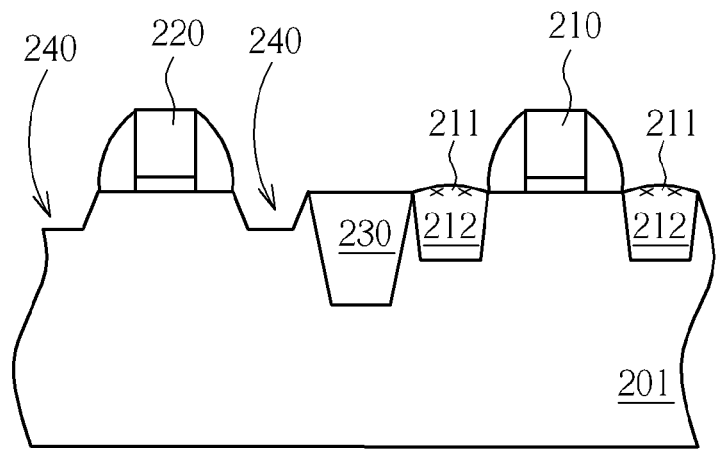

In the first example of the present invention, please refer to FIG. 5, the wet etching is carried out in the absence of the protection of a mask to selectively form a pair of trenches 240 in the substrate 201 around the second type semiconductor element 220. An etchant may be preferably used to carry out the wet etching step. For example, a basic etchant such as aqueous ammonia or other chemical agents may be used to carry out the wet etching step. The advantage to use a wet etching step is that the etching step can be more easily controlled. At this time, the doping for the first semiconductor element 210, a PMOS element for example, may be SiGe Epi. in situ doping or PLDD doping.

As described earlier, because the substrate 201 around the first semiconductor element 210 has the dopant 211 but the substrate 201 around the second semiconductor element 220 has no such dopant 211, in view of the difference in composition, both the substrate 201 and the SiGe structure 212 with the dopant 211 have a very low etch rate but the substrate 201 around the second semiconductor element 220 has a high etch rate. In other words, both the substrate 201 and the SiGe structure 212 with the dopant 211 are considered substantially not etched or damaged by the wet etching step. Table 1 shows the etching rates of the substrate with and without the dopant.

TABLE 1

| | substrate type | | |
|---|---|---|---|
| | N-type semiconductor element | P-type semiconductor element | etching selectivity |
| etching rate | 1260.58 Å | 1.69 Å | 746 |

In conclusion, the dopant 211 makes an etching selectivity which is large enough possible to the substrate 201 around the first semiconductor element 210 and around the second semiconductor element 220 so that the wet etching step can form a pair of trenches 240 in the substrate 201 around the second type semiconductor element 220 without substantially influencing the substrate 201 around the first semiconductor element 210.

Next, the first source/drain ion implantation and the second source/drain ion implantation can be respectively carried out on the first semiconductor element 210 and the second type semiconductor element 220. Optionally, the first source/drain ion implantation can be carried out before or after the second source/drain ion implantation.

Figure 6:
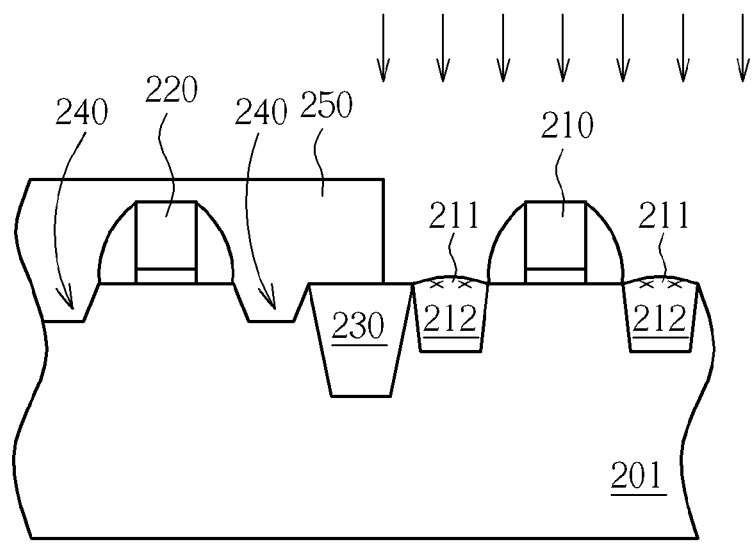

For example, if the first source/drain ion implantation is carried out before the second source/drain ion implantation, please refer to FIG. 6, first a mask 250 is used to cover the corresponding region around the second type semiconductor element 220 to perform the first source/drain ion implantation. After the completion of the first source/drain ion implantation, the mask 250 is removed. Then, please refer to FIG. 7, a mask 251 is used to cover the corresponding region around the first semiconductor element 210 to perform the second source/drain ion implantation. After the completion of the second source/drain ion implantation, the mask 251 is removed. The mask 250 and the mask 251 may be respectively a patterned photoresist material layer. In accordance with different exposure conditions, the photoresist material layer may be a positive photoresist or a negative photoresist. In addition, in accordance with different exposure wavelengths, the photoresist material layer may include various different organic materials, such as acrylate, vinyl ketone and polyhydroxystyrene (PHS) . . . etc. Persons of ordinary skills in the art may choose suitable photoresist materials to meet different demands.

Figure 7:
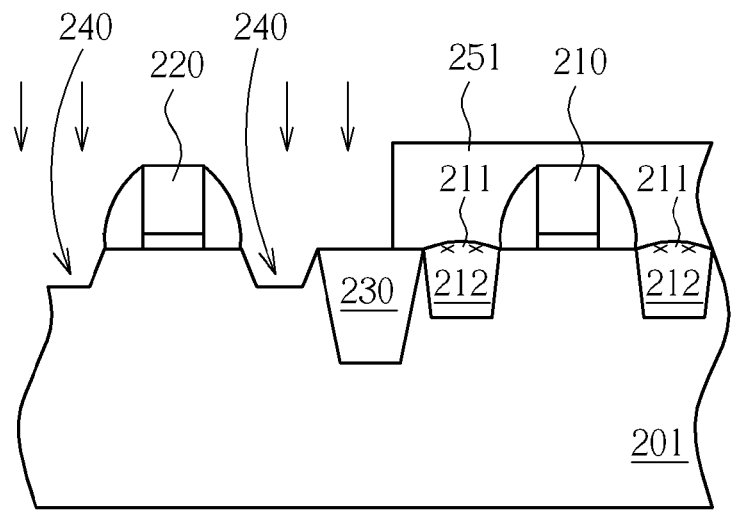

Besides, if the first source/drain ion implantation is carried out after the second source/drain ion implantation, please refer to FIG. 7, a mask 251 is first used to cover the corresponding region around the first semiconductor element 210 to perform the second source/drain ion implantation. After the completion of the second source/drain ion implantation, the mask 251 is removed. Afterwards, please refer to FIG. 6, a mask 250 is used to cover the corresponding region around the second type semiconductor element 220 to perform the first source/drain ion implantation. After the completion of the first source/drain ion implantation, the mask 250 is removed.

In the second embodiment of the present invention, at least one of the first source/drain ion implantation and the second source/drain ion implantation is carried out prior to the wet etching procedure in the absence of the protection of a mask to selectively form a pair of trenches 240 in the substrate 201 around the second semiconductor element 220. That is, optionally, the wet etching procedure is carried out after both the first source/drain ion implantation and the second source/drain ion implantation are finished. Or alternatively, the wet etching procedure is carried out between the first source/drain ion implantation and the second source/drain ion implantation. At this time, the doping for the first semiconductor element 210, a PMOS element for example, may be an S/D implantation.

Figure 8:
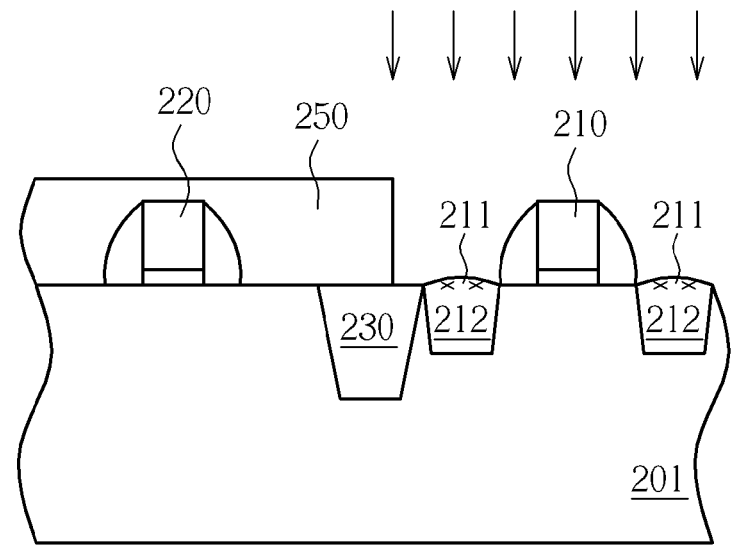
Figure 9:
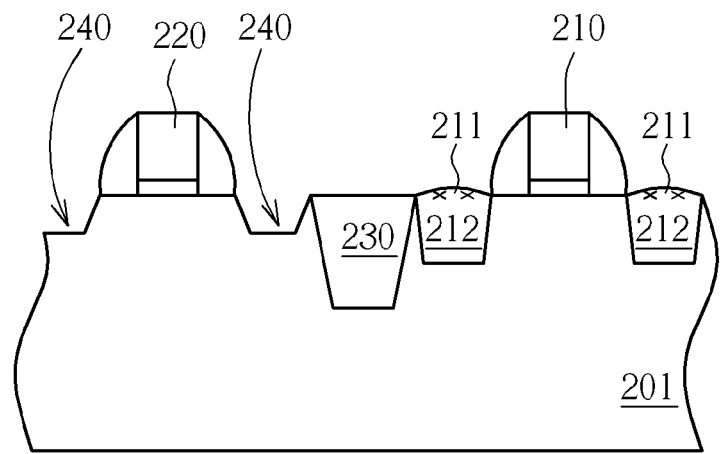
Figure 10:
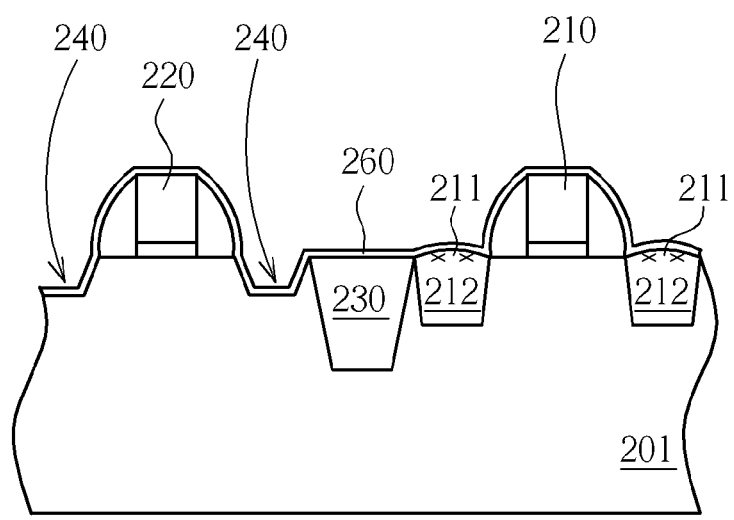

For example, if the wet etching procedure is carried out between the first source/drain ion implantation and the second source/drain ion implantation, please refer to FIG. 8, first a mask 250 is used to cover the corresponding region around the second type semiconductor element 220 to perform the first source/drain ion implantation. After the completion of the first source/drain ion implantation, the mask 250 is removed. Then, please refer to FIG. 9, the wet etching step is carried out to selectively form a pair of trenches 240 in the substrate 201 around the second type semiconductor element 220. An etchant may be used to carryout the wet etching step. For example, a basic etchant such as aqueous ammonia or other chemical agents may be used to carry out the wet etching step. Later, please refer to FIG. 10, a mask (not shown) is used to cover the corresponding region around the first semiconductor element 210 to perform the second source/drain ion implantation. After the completion of the second source/drain ion implantation, the mask (not shown) is removed. The mask may be a patterned photoresist material layer.

Figure 11:
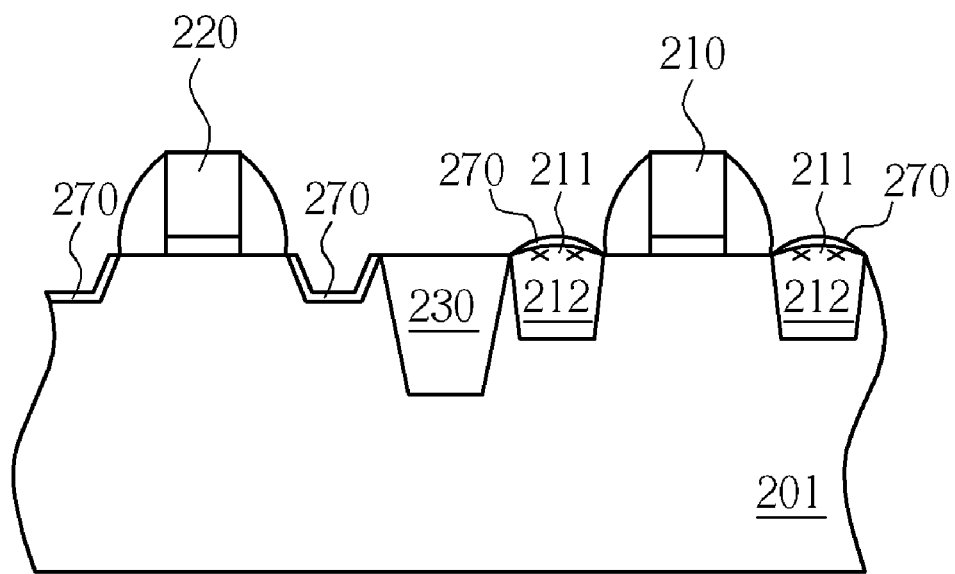

Next, please refer to FIG. 11, a required stress layer is formed. For example, a stress memorization technique, (SMT) is performed to construct a strained channel. Or, at least one contact etch stop layers (CESL) is formed to cover the substrate 201 to provide the first semiconductor element 210 and the second semiconductor element 220 of the substrate 201 with a corresponding stress. Those techniques are well known to persons of ordinary skills in the art and the details will not be discussed here.

Please note that, the substrate 201 around the first semiconductor element 210 has the dopant 211 but the substrate 201 around the second semiconductor element 220 has no such dopant 211, in view of the difference in composition, a wet etching step is able to selectively form a pair of trenches 240 in the substrate 201 around the second type semiconductor element 220 in the absence of the protection of a mask. Accordingly, no additional mask is needed and the simplified method makes the process easier and the etching result more even. Furthermore, the wet etching step does not destroy the crystal structure like what the dry etching step does. In such a way, the stress layer on the second type semiconductor element 220, such as the contact etch stop layers (CESL) with the tensile stress, may directly work on the channel of the second type semiconductor element 220 to make the second type semiconductor element 220 more efficiently form a tensile strained channel in order to increase the carrier mobility.

Moreover, please refer to FIG. 11, if needed, a silicide layer 270 may be respectively formed to be disposed around the first semiconductor element 210 and/or the second semiconductor element 220 to decrease the contact resistance. This technique is well known to persons of ordinary skills in the art and the details will not be discussed here.

In the above preferred embodiments, the first semiconductor element 210 of a P-type semiconductor element and the second semiconductor element 220 of an N-type semiconductor element are used for illustration and are not limited to this. In another example, the N-type semiconductor element may have the dopant and the wet etching is carried out in the absence of the protection of a mask to selectively form a pair of trenches 240 in the substrate 201 around the P-type semiconductor element in the absence of a mask. In such a way, the stress layer, such as the contact etch stop layers (CESL) with the compressive stress, may directly work on the channel of the P-type semiconductor element to make the P-type semiconductor element more efficiently form a compressive strained channel in order to increase the carrier mobility. SiC or other SMT may be used to construct the tensile strained channel of the N-type semiconductor element.

In the method of the present invention, the dopant is useful in changing the etching selectivity of the substrate to the wet etching step. Accordingly, the additional mask is omitted to carry out the wet etching step directly and trenches in the substrate around the second semiconductor element are obtained. Omitting one additional mask means much lower manufacturing cost. Because the present invention utilizes beneficial etching selectivity, the first type semiconductor element is substantially not influenced by the wet etching procedure in the absence of the protection of a mask.

Those skilled in the art will readily observe that numerous modifications and alterations of the device and method may be made while retaining the teachings of the invention.

What is claimed is:

1. A method for selective formation of trenches, comprising:
   providing an exposed substrate comprising a first semiconductor element having a dopant and a second semiconductor element;
   performing a wet etching procedure on said exposed substrate having said first semiconductor element and said second semiconductor element to selectively remove said exposed substrate having second semiconductor element while not removing said exposed substrate having said first semiconductor element with said dopant for forming a pair of trenches in said exposed substrate having said second semiconductor element;
   performing a first source/drain ion implantation on said first semiconductor element; and
   performing a second source/drain ion implantation on said second semiconductor element.

2. The method for selective formation of trenches of claim 1, wherein said substrate further comprises a shallow trench isolation disposed in said substrate to serve as an electrical isolation between said first semiconductor element and said second semiconductor element.

3. The method for selective formation of trenches of claim 1, wherein said first semiconductor element is a P-type semiconductor element and said second semiconductor element is an N-type semiconductor element.

4. The method for selective formation of trenches of claim 1, wherein said wet etching is carried out by a basic etchant.

5. The method for selective formation of trenches of claim 1, wherein said basic etchant is aqueous ammonia.

6. The method for selective formation of trenches of claim 1, wherein said first source/drain ion implantation and said second source/drain ion implantation are carried out after said wet etching is carried out.

7. The method for selective formation of trenches of claim 1, wherein said wet etching is carried out after said first source/drain ion implantation and said second source/drain ion implantation are carried out.

8. The method for selective formation of trenches of claim 1, wherein said wet etching is carried out after said first source/drain ion implantation is carried out and said second source/drain ion implantation is carried out after said wet etching is carried out.

9. The method for selective formation of trenches of claim 1, further comprising:
   forming an SiGe structure having said dopant and disposed around said first semiconductor element to construct a compressive strained channel.

10. The method for selective formation of trenches of claim 1, further comprising:
    performing a stress memorization technique (SMT) to construct a strained channel.

11. The method for selective formation of trenches of claim 1, further comprising:
    forming a contact etch stop layers (CESL) covering said substrate to provide said substrate with a stress.

12. The method for selective formation of trenches of claim 1, further comprising:
    forming a silicide layer disposed around said first semiconductor element.

13. The method for selective formation of trenches of claim 1, further comprising:
    forming a silicide layer disposed around said second semiconductor element.

14. The method for selective formation of trenches of claim 1, wherein a mask is used to cover said second semiconductor element to perform said first source/drain ion implantation on said first semiconductor element.

15. The method for selective formation of trenches of claim 1, wherein a mask is used to cover said first semiconductor element to perform said second source/drain ion implantation on said second semiconductor element.

* * * * *